United States Patent
Thothadri et al.

(10) Patent No.: US 12,140,864 B2
(45) Date of Patent: Nov. 12, 2024

(54) LARGE AREA SEAMLESS MASTER AND IMPRINT STAMP MANUFACTURING METHOD

(71) Applicant: Applied Materials, Inc., Santa Clara, CA (US)

(72) Inventors: Manivannan Thothadri, Mountain View, CA (US); Kevin Laughton Cunningham, Belmont, CA (US); Arvinder Chadha, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 607 days.

(21) Appl. No.: 17/428,001

(22) PCT Filed: Feb. 9, 2020

(86) PCT No.: PCT/US2020/017385
§ 371 (c)(1),
(2) Date: Aug. 3, 2021

(87) PCT Pub. No.: WO2020/167617
PCT Pub. Date: Aug. 20, 2020

(65) Prior Publication Data
US 2022/0121114 A1    Apr. 21, 2022

Related U.S. Application Data

(60) Provisional application No. 62/804,019, filed on Feb. 11, 2019.

(51) Int. Cl.
*G03F 7/00*    (2006.01)
*B29C 35/02*    (2006.01)
(Continued)

(52) U.S. Cl.
CPC ............. *G03F 7/0015* (2013.01); *B29C 35/02* (2013.01); *B29C 59/026* (2013.01); *B82Y 40/00* (2013.01);
(Continued)

(58) Field of Classification Search
CPC .... G03F 7/0015; G03F 7/0002; G03F 7/0035; B29C 35/02; B29C 59/026; B29C 59/02; B82Y 40/00; B82Y 10/00
(Continued)

(56) References Cited

U.S. PATENT DOCUMENTS 8,703,406 B2    4/2014   Schaper
2013/0153534 A1  6/2013   Resnick et al.
(Continued)

FOREIGN PATENT DOCUMENTS

JP    2014144641 A    8/2014

OTHER PUBLICATIONS

Japan Office Action dated Oct. 6, 2023 Japanese Patent Appl. No. 2021-546685.
(Continued)

*Primary Examiner* — Galen H Hauth
*Assistant Examiner* — Lawrence D. Hohenbrink, Jr.
(74) *Attorney, Agent, or Firm* — Patterson + Sheridan, LLP

(57) ABSTRACT

Embodiments of the present disclosure generally relate to pattern replication, imprint lithography, and more particularly to methods and apparatuses for creating a large area imprint without a seam. Methods disclosed herein generally include filling seams between pairs of masters with a filler material such that the seams are flush with a surface of the masters having a plurality of features disposed thereon.

15 Claims, 9 Drawing Sheets

(51) Int. Cl.
   *B29C 59/02* (2006.01)
   *B82Y 40/00* (2011.01)
   *B82Y 10/00* (2011.01)

(52) U.S. Cl.
   CPC .............. *B29C 59/02* (2013.01); *B82Y 10/00* (2013.01); *G03F 7/0002* (2013.01); *G03F 7/0035* (2013.01)

(58) Field of Classification Search
   USPC ........................................................ 264/494
   See application file for complete search history.

(56) References Cited

U.S. PATENT DOCUMENTS

| | | | |
|---|---|---|---|
| 2016/0054498 A1* | 2/2016 | Chung .................. | G03F 7/0002 264/263 |
| 2016/0306275 A1 | 10/2016 | Park et al. | |
| 2018/0046075 A1* | 2/2018 | Han .................... | B29C 33/3842 |
| 2018/0178416 A1* | 6/2018 | Richez .................. | B29C 59/026 |
| 2021/0086407 A1* | 3/2021 | Peng ........................ | B29C 33/56 |

OTHER PUBLICATIONS

International Search Report and Written Opinion, PCT/US2020/017385, Jun. 4, 2020.

* cited by examiner

LARGE AREA SEAMLESS MASTER AND IMPRINT STAMP MANUFACTURING METHOD

BACKGROUND

Field

Embodiments of the present disclosure generally relate to pattern replication, imprint lithography, and more particularly to methods and apparatuses for creating a large area imprint without a seam.

Description of the Related Art

Imprint lithography is a contact patterning method that can be used to fabricate nanometer scale patterns. Generally, imprint lithography begins by creating a template of a pattern. A liquid, such as a photoresist, is deposited on the substrate to be patterned. Then, the patterned template is pressed against the liquid to imprint the pattern on the substrate. The patterned substrate is then cured either thermally or by using ultraviolet light to solidify the patterning in the photoresist on the substrate.

However, conventional imprint lithography methods and apparatus have various challenges. For example, conventional imprint lithography methods based on silicon are not suitable for large area substrates (greater than 300 mm), such as display devices, because conventionally used masters are not large enough to pattern large area displays. As such, some conventional imprint methods have used multiple masters, which have been adhered to one another. However, a seam is formed between the masters and at the periphery, which is then transferred into the patterning on the substrate. The patterned irregularities at the seams and periphery can cause decreased device efficiency and even device failure. For example, in the case of a light guided panel (LGP), when a seam is imprinted into the LGP, it becomes a surface feature that could direct or out-couple light out of the LGP. In the case of liquid crystal display (LCD), when a seam is imprinted into the LCD, the viewer will see the seam in the display or can result in a mura defect.

Therefore, there is a need for improved imprint lithography methods and apparatuses that can be used to imprint large area substrates.

SUMMARY

Embodiments of the present disclosure generally relate to pattern replication, imprint lithography, and more particularly to methods and apparatus for creating a large area imprint without a seam. Methods disclosed herein generally include filling seams between pairs of masters with a filler material such that the seams are flush with a surface of the masters having a plurality of features disposed thereon.

In one embodiment, a method of forming a seamless master comprises depositing a first anti-stick layer on a substrate, aligning a plurality of masters on the substrate, each master having a plurality of features extending from a first surface, the first surface of the plurality of masters being conformal with the first anti-stick layer, and adhering a second surface of the plurality of masters to a backing plate, the second surface being opposite the first surface. Adjacent masters of the plurality of masters have a seam therebetween extending from the first anti-stick layer to the backing plate. The method further comprises filling the seam between the adjacent masters of the plurality of masters with a filler material, curing the filler material, and removing the plurality of masters from the first anti-stick layer and the substrate.

In another embodiment, a method of forming a seamless master comprises adhering a plurality of masters to a backing plate, each master having a plurality of features extending from a first surface, and each pair of the plurality of masters having a seam therebetween. A second surface of the plurality of masters opposite the first surface is adhered to the backing plate. The method further comprises depositing a masking film over a portion of each of the plurality of masters, the portion being disposed on the first surface of each of the plurality of masters, filling the seam between each pair of the plurality of masters with a filler material, curing the filler material, and removing the masking film.

In yet another embodiment, a method of forming a seamless master comprises adhering a plurality of masters to a backing plate, each master having a plurality of features extending from a first surface, and each pair of the plurality of masters having a seam therebetween. A second surface of the plurality of masters opposite the first surface is adhered to the backing plate. The method further comprises filling the seam between each pair of the plurality of masters with a filler material. Filling the seam between each pair of masters comprises depositing excess filler material on the first surface of each of the plurality of masters. The method further comprises curing the filler material and the excess filler material, and removing the excess filler material disposed on the first surface of each of the plurality of masters.

In one embodiment, a method of forming a seamless stamp comprises adhering a plurality of masters to a backing plate, each master having a plurality of features extending from a first surface, and each pair of the plurality of masters having a seam therebetween. A second surface of the plurality of masters opposite the first surface is adhered to the backing plate. The method further comprises placing seam blocking strips over each seam, the seam blocking strips being in contact with the first surface of each pair of the plurality of masters disposed adjacent to the seam, depositing stamp material over the first surface of each of the plurality of masters and the seam blocking strips, curing the stamp material, and removing the stamp material from the plurality of masters to form the seamless stamp, the seamless stamp comprise the seam blocking strips.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to pattern replication, imprint lithography, and more particularly to methods and apparatus for creating a large area imprint without a seam. Methods disclosed herein generally include filling seams between pairs of masters with a filler material such that the seams are flush with a surface of the masters having a plurality of features disposed thereon.

Figure 1A:
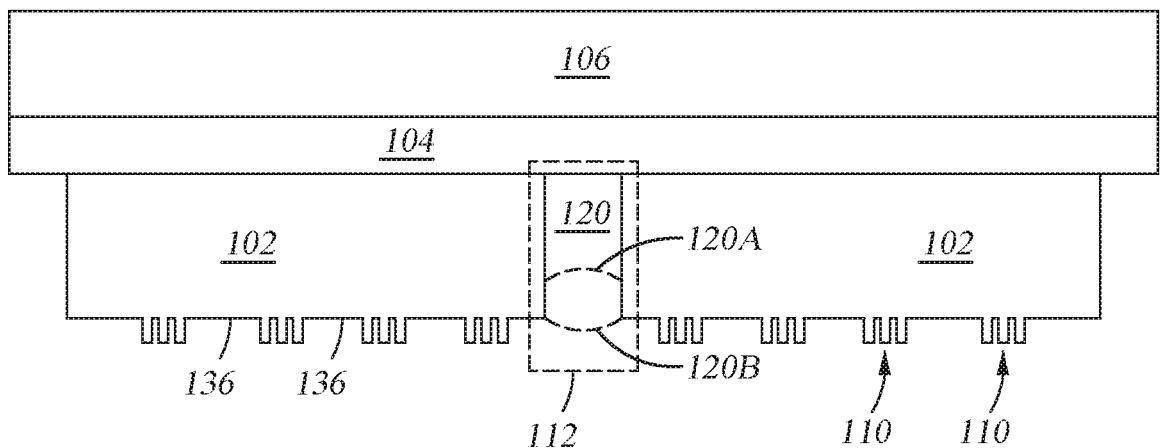
FIGS. 1A-1F depict various stages of an imprint stamp manufacturing method, according to embodiments disclosed herein.
Figure 1B:
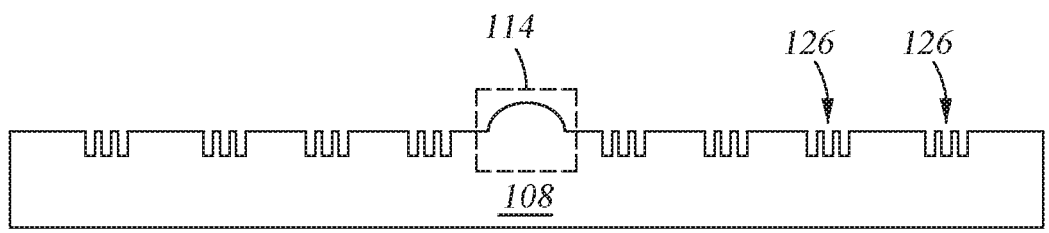
Figure 1C:
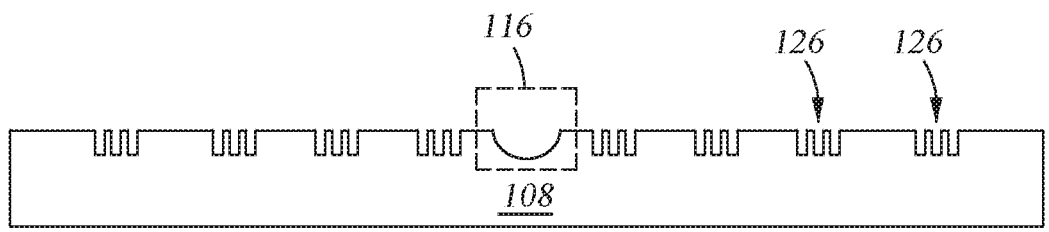
Figure 1D:
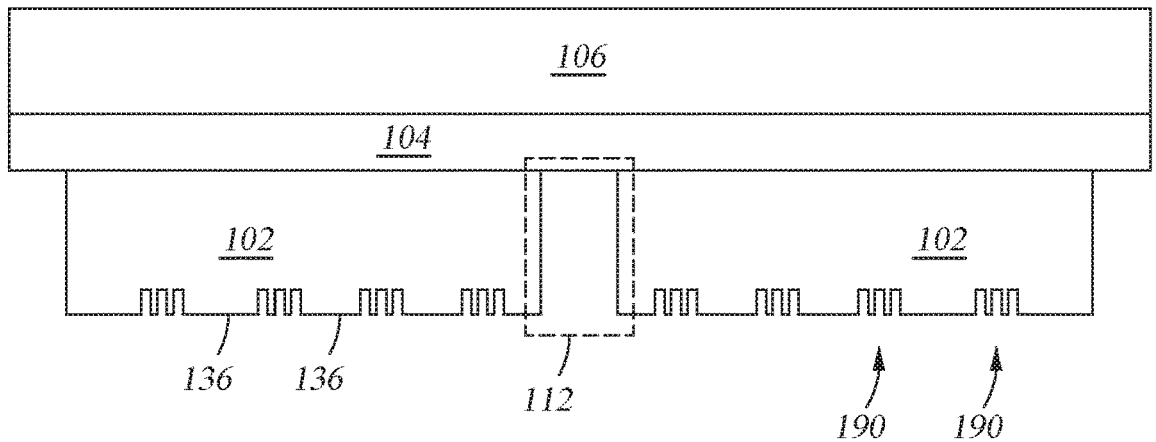

FIGS. 1A-1F depict various stages of an imprint stamp manufacturing method according to embodiments disclosed herein, and are cross-sectional views. The method begins by adhering a plurality of masters 102 onto a backing plate 106 using a bonding material 104. Two masters 102 are adhered to the backing plate 106 in the embodiment shown in FIG. 1A. The masters 102 have a pattern of features 110 thereon. FIG. 1D is similar to FIG. 1A. FIG. 1D illustrates an embodiment where the plurality of masters 102 have an alternative pattern of features 190 thereon. The alternative pattern of the features 190 of FIG. 1D are the inverse of the pattern of the features 110 of FIG. 1A. The alternative pattern of features 190 are disposed below the surface 136 of the masters 202, rather than extending above the surface 136 of the masters 202 like the pattern of features 110. While shown to be disposed at the same depth, each of the features 110 of FIG. 1A and each of the features 190 of FIG. 1D may be disposed at different depths.

A seam 112 is formed between the two masters 102. The seam 112 is filled with a filler material 120, as shown in FIG. 1A. Generally, the filler material 120 will not fill the seam 112 in a manner that results in a completely flat surface. Instead, if the seam 112 is underfilled with filler material 120, the seam 112 will become concave, as shown by the dotted line 120A. In another embodiment, the seam 112 is overfilled with filler material 120 and becomes convex, as shown by the dotted line 120B. An anti-stick layer (not shown) may be coated or deposited on the surface of the master 102 having the pattern of features 110 thereon prior to the stamp forming or imprinting process.

FIG. 1B and FIG. 1O illustrate stamps 108 formed by using the masters 102 of FIG. 1A. FIG. 1B further illustrates stamps 108 formed by using the masters 102 of FIG. 1A having no filler material 120 disposed in the seam 112. To form a stamp 108, stamp material is contacted by the masters 102 and then cured using UV curing, thermal cuing, or thermoforming. The stamp 108 is a negative pattern of the masters 102. As such, in an embodiment where the seam 112 between masters 102 is underfilled with filler material 120 (shown by the dotted line 120A in FIG. 1A), the stamp 108 includes negative features 126 and a convex portion 114 at the position corresponding to the concave seam 112, as shown in FIG. 1B. FIG. 1O illustrates an embodiment where the seam 112 is overfilled with filler material 120 (shown by the dotted line 120B of FIG. 1A), resulting in the stamp 108 having negative features 126 and a convex portion 116 at the position corresponding to the convex seam 112. Stamps formed using the masters 102 of FIG. 1D having the alternative pattern of features 190 would have negative features 126 extending from the surface of the stamp.

Figure 1E:
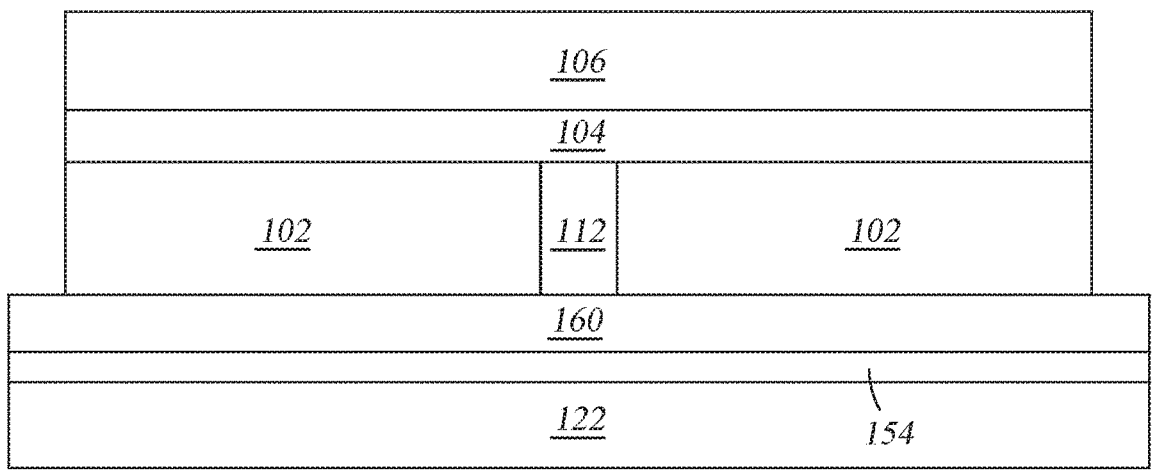
Figure 1F:
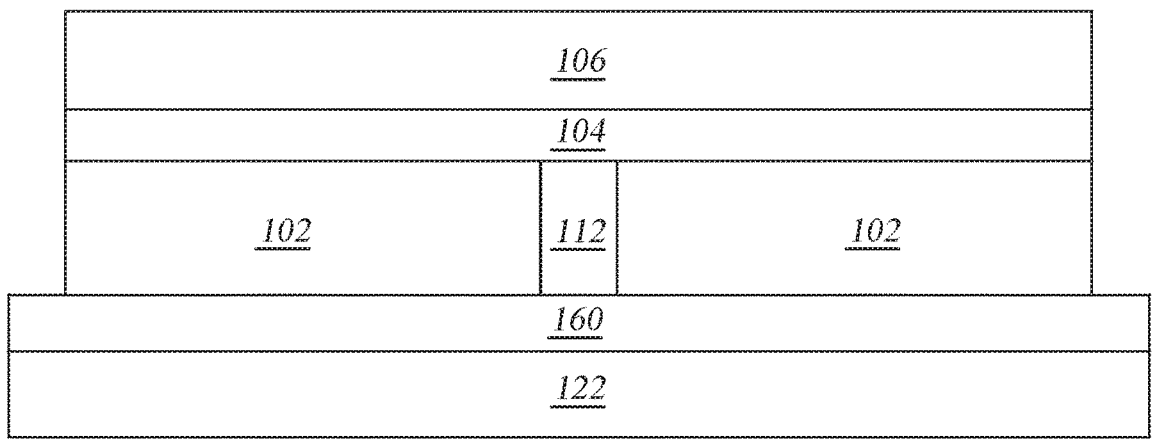

Stamp material may be dispensed on to the masters 102 to form the stamp 108, resulting in a free standing stamp 108 like shown in FIGS. 1B-1C. Alternatively, stamp material 160 may be dispensed on to a substrate 122, and then patterned by the masters 102, like shown in FIG. 1E-1F. FIG. 1E illustrates an anti-stick layer 154 dispensed between the substrate 122 and the stamp material 160. Once the stamp material 160 has been patterned by the masters 102 and cured, the substrate 122 and the anti-stick layer 154 of FIG. 1E may be removed from the stamp 108, resulting in a free standing stamp 108. FIG. 1F shows an embodiment where stamp material 160 is dispensed directly onto the substrate 122. In the embodiment of FIG. 1F, the stamp material 160 may be patterned by the masters 102 and cured, and the substrate 122 may act as a handle for the stamp 108 (i.e., the substrate 122 may not be removed from the stamp 108).

The stamp 108 may then be used to imprint and pattern a photoresist material which is deposited over a substrate to form a final product. The final product may include a photoresist material which has been patterned with the plurality of negative features 126 of the stamp 108, as well as concave portion 114 or the convex portion 116 corresponding to the overfilled or underfilled seam 112. Since the method includes two transfer imprints, at the stamp level and the final product level, the final product is a positive image of the masters 102 and the seam 112.

FIGS. 2A-2G depict various embodiments of forming a seamless master 200 for imprint stamp manufacturing, according to embodiments disclosed herein, and are cross-sectional views. FIG. 2H illustrates a formed seamless master 270. The methods depicted in FIGS. 2A-2G provide a master-level solution to seam and periphery challenges. In FIGS. 2A-2G, the method of forming a seamless master 200 begins by adhering a plurality of masters 202 onto a backing plate 206 using bonding material 204. As shown in FIGS. 2A-2H, two masters 202 are adhered to the backing plate 206 with a seam 212 disposed between each master 202. The backing plate 206 may be one or more backing plates 206, each having one or more masters 202 bonded thereon.

In FIGS. 2A-2G, the masters 202 have a pattern of features 210 thereon, and the masters 202 are flush or conformal to a surface 222A of a substrate 222. The masters 202 may have an alternative pattern of features thereon, like shown in FIG. 1D. The substrate 222 is generally any suitable substrate material, including but not limited to, glass, PMMA, and polycarbonate. The surface 222A of the substrate 222 may be textured, such as having grooves or ridges, to enable clamping. The clamping may be electrostatic, vacuum, mechanical, microelectromechanical system (MEMS), or a combination of methods. The backing plate 206 or the substrate 222, or a combination of both, may be used for alignment of the masters 202. For example, in one embodiment, the plurality of masters 202 is disposed on the substrate 222 prior to adhering the masters 202 to the backing plate 206. In another embodiment, plurality of masters 202 is adhered to the backing plate 206, and then the masters 202 are disposed on the substrate 222.

An anti-stick layer 224 may be disposed on the surface 222A of the substrate 222 such that the features 210 of the masters 202 contact the anti-stick layer 224. The anti-stick layer 224 may be deposited on the substrate 222 prior to the masters 202 being disposed on the substrate 222. The features 210 of the masters 202 may be disposed in the anti-stick layer 224 such that a first surface 236 of the masters 202 recessed from the features 210 (i.e., the spaces between the features 210 of the masters 202) is flush or conformal to the anti-stick layer 224. The features 210 may be conformal with the surface 222A of the substrate 222 while the first surface 236 of the masters 202 is conformal with the anti-stick layer 224. In such embodiment, the anti-stick layer 224 may have a thickness of about 100-200 nm such that the thickness of the anti-stick layer 224 is about equal to the length of the features 210. The anti-stick layer 224 may consist of any suitable material that enables anti-stiction properties, such as compounds including halogens, silane, etc.

Figure 2A:
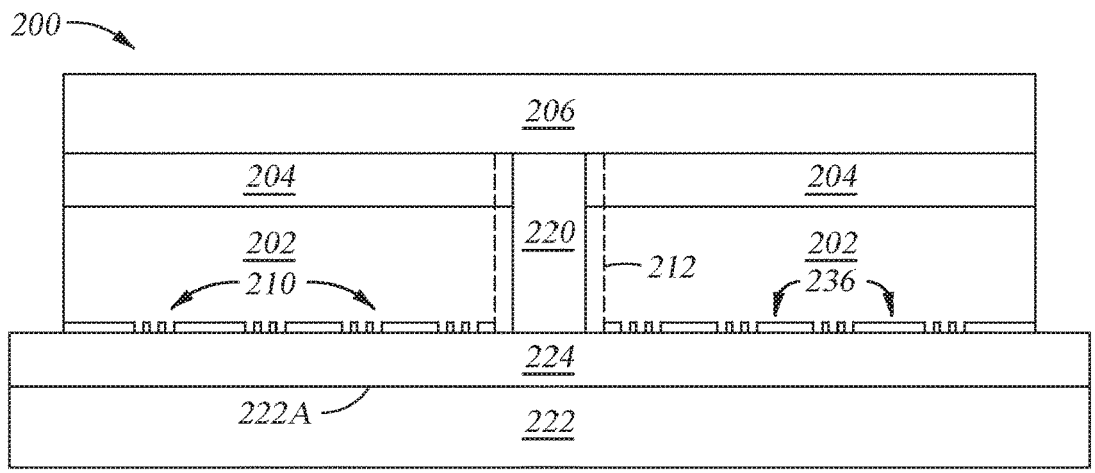
FIGS. 2A-2G depict various embodiments of forming a seamless master for imprint stamp manufacturing, according to embodiments disclosed herein.

In the embodiment of FIG. 2A, the bonding material 204 is continuous across the backing plate 206. A filler material 220, such as a polymer, is deposited in the seam 212 between the masters 202 extending from the anti-stick layer 224 to the backing plate 206. The filler material 220 may be injected from the seam location 212 in the z-direction. The filler material 220 may be deposited in the seam 212 concurrently with the bonding of the masters 202 to the backing plate 206. In an embodiment where the features 210 are disposed in the anti-stick layer 224, the filler material 220 may be substantially even with or planar to the first surface 236 of the masters 202. In an embodiment where the anti-stick layer 224 is not used, any excess filler material 220 disposed between the first surface 236 and the features 210 may be removed. The filler material 220 and the bonding material 204 may be cured at the same time, or may be cured individually at different times.

Figure 2B:
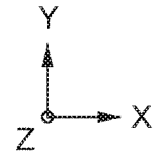
Figure 2B:
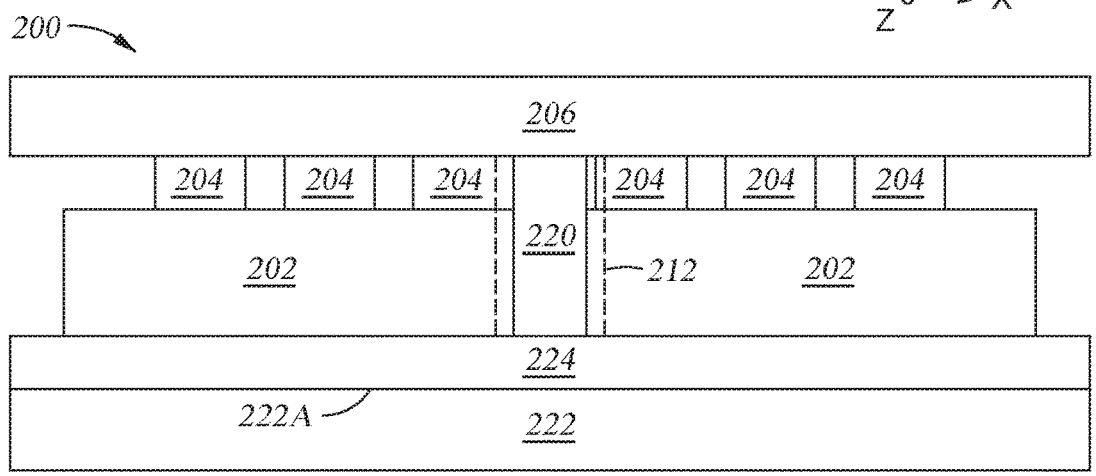

FIG. 2B illustrates another embodiment of forming a seamless master 200. Similar to FIG. 2A, the filler material 220 may be injected from the seam location 212 in the z-direction. The bonding material 204 may be applied to the backing plate 206 using screen printing or precision dispense. As such, the bonding material 204 need not be continuous across the backing plate 206. Once the filler material 220 is disposed in the seam 212 between the masters 202, the filler material 220 is cured. The filler material 220 and the bonding material 204 may be cured at the same time, or may be cured individually at different times.

Figure 2C:
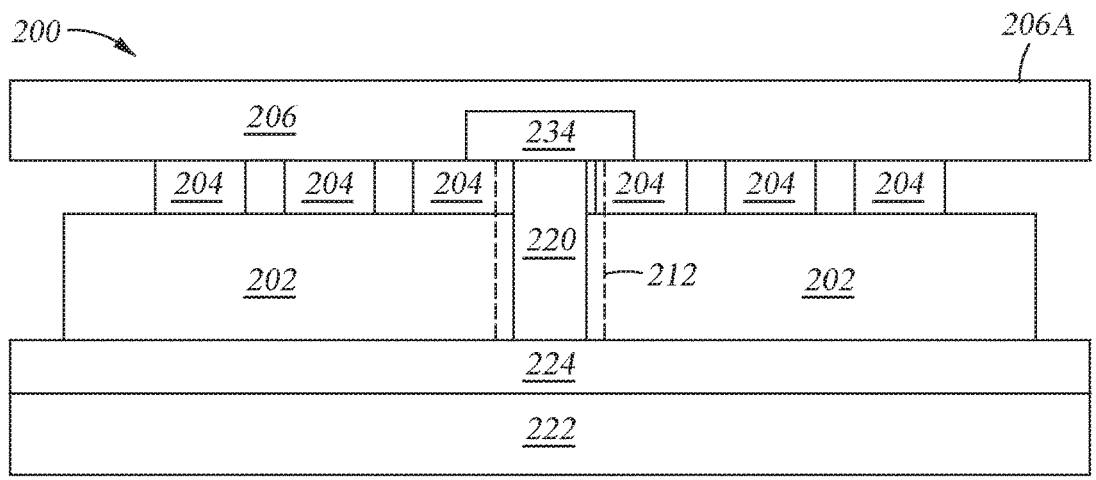

FIG. 2C illustrates an embodiment of forming a seamless master 200 using a via 234. In the embodiment of FIG. 2C, the backing plate 206 comprises a via 234 disposed directly above and connected with the seam 212 for injecting the filler material 220 into the seam 212. The via 234 extends through the backing plate 206 along the z-axis, parallel to the top surface 206A of the backing plate 206 and perpendicular to the seam 212. The via 234 may extend through the entire backing plate 206 from a first side surface of the backing plate 206 to a second side surface of the backing plate 206 opposite the first side surface, the first side surface and the second side surface of the backing plate 206 being perpendicular and adjacent to the top surface 206A of the backing plate 206.

The filler material 220 is injected into the via 234 in the z-direction to fill the seam 212. The filler material 220 may extend from the anti-stick layer 224 to the via 234 to fill the seam 212. The via 234 may comprise excess filler material 220 after the seam 212 has been filled. Once the filler material 220 is disposed in the seam 212 between the masters 202, the filler material 220 is cured. The filler material 220 and the bonding material 204 may be cured at the same time, or may be cured individually at different times.

Figure 2D:
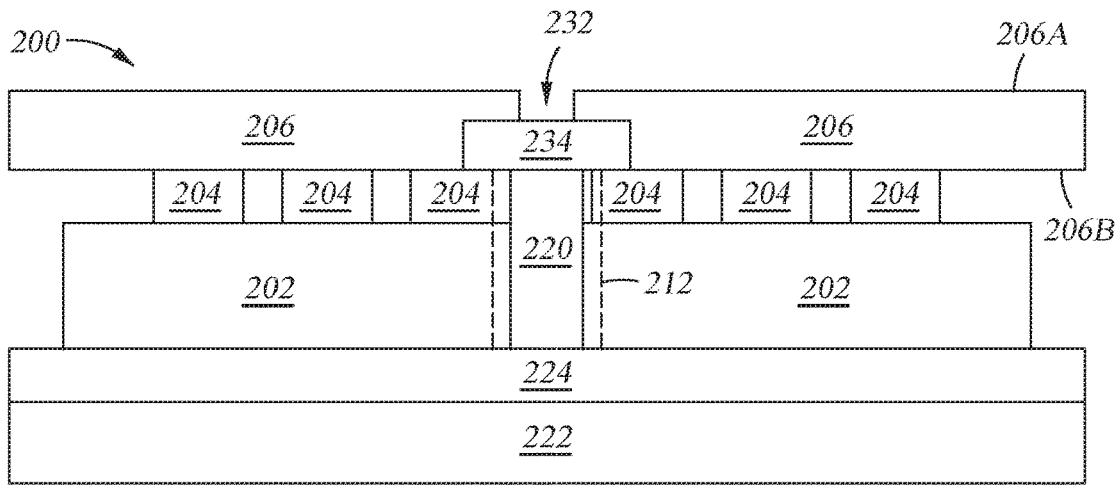

FIG. 2D illustrates another embodiment of forming a seamless master 200 using a pair of vias 232, 234. In the embodiment of FIG. 2D, the backing plate 206 comprises a pair of vias 232, 234 for injecting the filler material 220 into the seam 212. The backing plate 206 may comprise a first via 232 disposed directly above the seam 212 for injecting the filler material 220 through the backing plate 206. The first via 232 extends through the entire backing plate 206 from the top surface 206A of the backing plate 206 to a bottom surface 206B of the backing plate to be connected with the seam 212. The bottom surface 206B of the backing plate 206 is opposite the top surface 206A and is in contact with the bonding material 204. The first via 232 extends through the backing plate 206 along the y-axis, perpendicular to the top surface 206A of the backing plate 206 and parallel to the seam 212. The filler material 220 may extend from the anti-stick layer 224 to the first via 232 to fill the seam 212.

The backing plate 206 may further comprise a second via 234 disposed directly above and connected with the seam 212 for injecting the filler material 220 into the seam 212. The second via 234 extends through the backing plate 206 along the z-axis, parallel to the top surface 206A of the backing plate 206 and perpendicular to the seam 212. The second via 234 may extend through the entire backing plate 206 from a first side surface of the backing plate 206 to a second side surface of the backing plate 206 opposite the first side surface, the first side surface and the second side surface of the backing plate 206 being perpendicular and adjacent to the top surface 206A of the backing plate 206.

The filler material 220 may be injected into the seam 212 using the first via 232 and/or the second via 234. The filler material 220 may be dispensed into the seam 212 from the z-direction, the y-direction, or a combination of both the z- and y-directions. The filler material 220 may extend from the anti-stick layer 224 to the second via 234 or to the first via 232 to fill the seam 212. The first via 232 and the second via 234 may overlap directly above the seam 212 such that the second via 234 connects the first via 232 with the seam 212. The first via 232 and/or the second via 232 may comprise excess filler material 220 after the seam 212 has been filled. Once the filler material 220 is disposed in the seam 212 between the masters 202, the filler material 220 is cured. The filler material 220 and the bonding material 204 may be cured at the same time, or may be cured individually at different times.

Figure 2E:
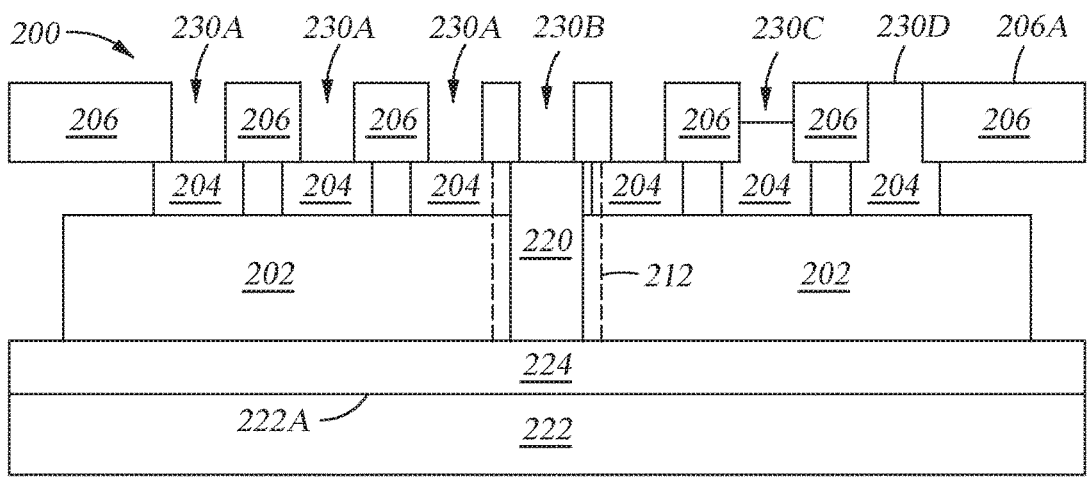

FIG. 2E illustrates yet another embodiment of forming a seamless master 200 using an array of vias 230A-230D. In the embodiment of FIG. 2E, the backing plate 206 comprises an array of vias 230A-230D for dispensing bonding material 204 and/or filler material 220. Each of the vias 230A-230D extends through the backing plate 206 along the y-axis, perpendicular to the top surface 206A of the backing plate 206 and parallel to the seam 212.

The vias 230A illustrate dispensing bonding material 204 through the backing plate 206 along the y-axis to adhere the backing plate 206 to the masters 202. The vias 230A are left unfilled after the bonding material 204 has been dispensed.

In other words, the bonding material 204 is disposed between the backing plate 206 and the master 202, and may not remain in the vias 230A within the backing plate 206.

The via 230B of FIG. 2E illustrates dispensing the filler material 220 into the seam 212 disposed between the masters 202. The via 230B is disposed directly above and is connected with the seam 212. The filler material 220 may be dispensed through the backing plate 206 from the z-direction, the y-direction, or a combination of both the z- and y-directions to fill seam 212. Once the filler material 220 is disposed in the seam 212 between the masters 202, the filler material 220 is cured. The filler material 220 may extend from the anti-stick layer 224 to the backing plate 206 to fill the seam 212. In one embodiment, the filler material 220 may extend from the anti-stick layer 224 in to the via 230B to fill the seam 212.

The via 230C of FIG. 2E illustrates dispensing the bonding material 204 through the backing plate 206 along the y-axis to adhere the backing plate 206 to a master 202, resulting in the via 230C being partially filled with excess bonding material 204. After the bonding material 204 is dispensed through the via 230C to be disposed between the backing plate 206 and master 202, the via 230C may comprise excess bonding material 204 to be partially filled.

The via 230D of FIG. 2E illustrates dispensing bonding material 204 through the backing plate 206 along the y-axis to adhere the backing plate 206 to a master 202 while completely filling the via 230D with the bonding material 204. Once the bonding material 204 is dispensed to be disposed between the backing plate 206 and the master 202, the via 230D is filled with excess bonding material 204 such that the excess bonding material 204 is planar with the top surface 206A of the backing plate 206. The bonding material 204 and the filler material 220 may partially or completely fill each of the one or more vias 230A-230D, or each of the vias 230A-230D may remain unfilled. The array of vias 230A-230D may assist in outgassing of the bonding material 204 and the filler material 220. After deposition, the filler material 220 and the bonding material 204 may be cured at the same time, or may be cured individually at different times.

Figure 2F:
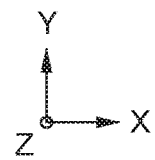
Figure 2F:
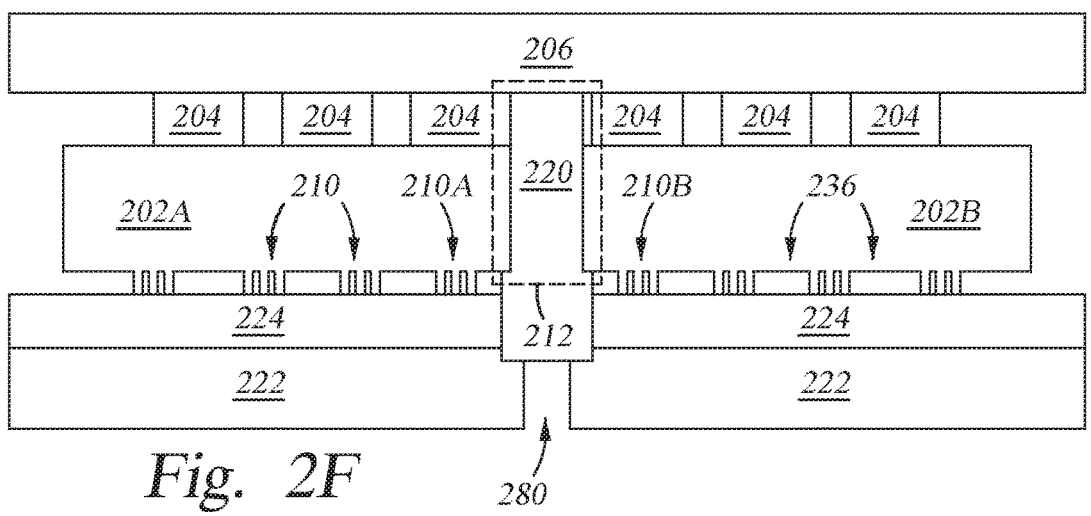

FIG. 2F illustrates dispensing filler material 220 through a via 280 in the substrate 222. In the embodiment of FIG. 2F, the via 280 may have a size that is the same size as the seam 212, or less than space between adjacent the features 210A of the first master 202A and the features 210B of the second master 202B. In one embodiment, the via 280 may be larger than the space between adjacent the features 210A of the first master 202A and the features 210B of the second master 202B such that is extends over the features 210A and 210B. The via 280 may be formed such that when filled with the filler material 220, the filler material 220 contacts the first surface 236 of the masters 202. The filler material 220 may be dispensed into the seam 212 in the z-direction, the y-direction, or a combination of both the z- and y-directions. The bonding material 204 may be dispensed through the y-direction or through the z-direction. Once the filler material 220 is dispensed in the seam 212, the filler material 220 is cured. Any excess filler material 220, such as any filler material 220 disposed over the features 210A and 210B may then be removed chemically, mechanically, selectively, by plasma, or any combination of the methods.

Figure 2G:
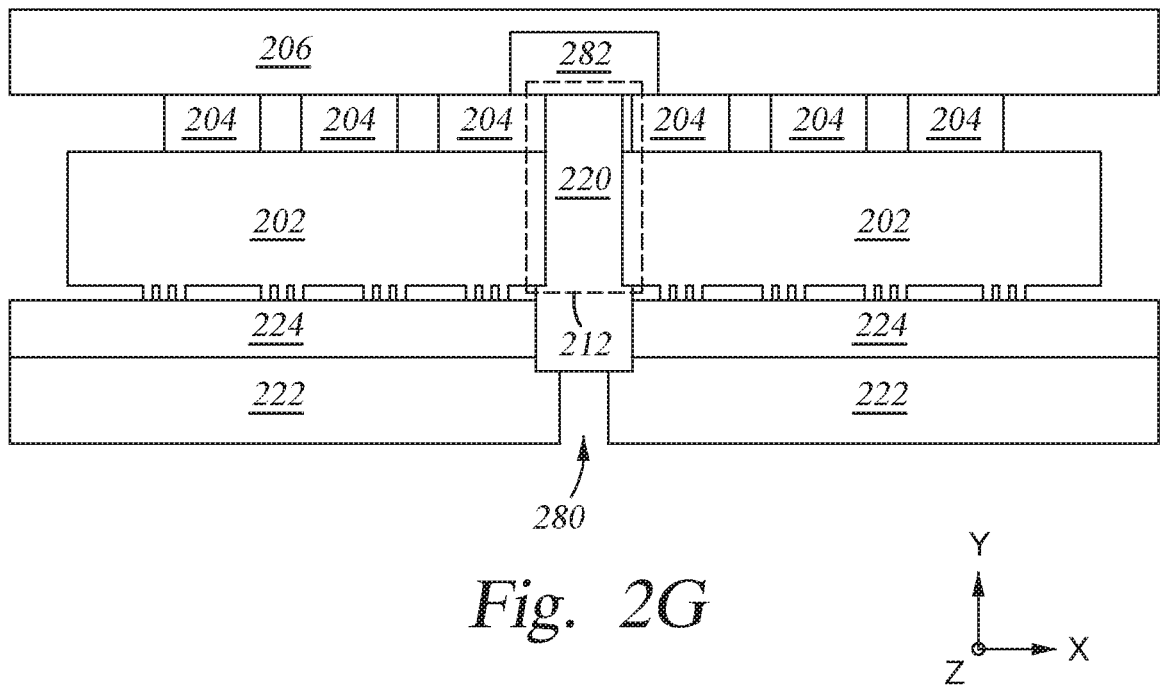
Figure 2H:
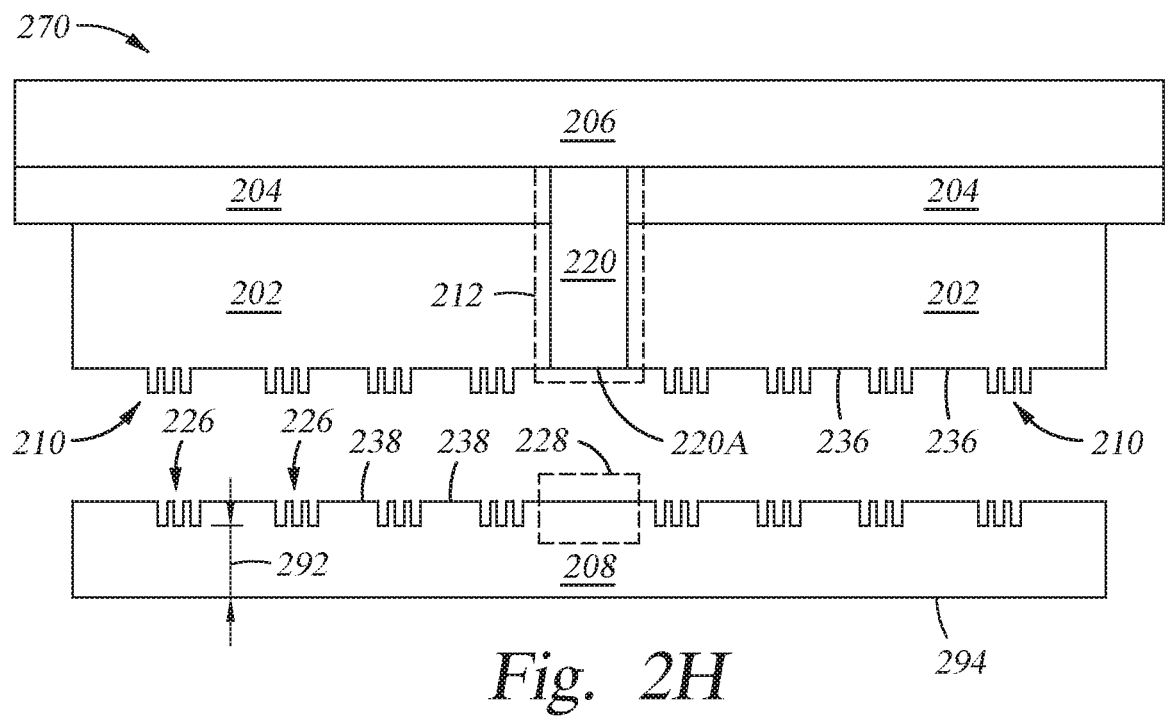
FIG. 2H illustrates a formed seamless master for imprint stamp manufacturing, according to embodiments disclosed herein.

FIG. 2G illustrates dispensing filler material 220 through a first via 280 in the substrate 222 and/or a second via 282 in the backing plate 206. The first via 280 may be the via 280 of FIG. 2F. The first via 280 is disposed through the substrate 222 and the second via 282 is disposed through the backing plate 206. The filler material 220 may be dispensed in the seam through the first via 280, the second via 282, or a combination of both the first and the second vias 280, 282. The filler material 220 may be dispensed into the seam 212 in the z-direction, the y-direction, or a combination of both the z- and y-directions. The bonding material 204 may be dispensed through the y-direction or through the z-direction. Once the filler material 220 is dispensed in the seam 212, the filler material 220 is cured. Any excess filler material 220, such as any filler material 220 disposed over the features 210A and 210b may then be removed chemically, mechanically, selectively, by plasma, or any combination of the methods.

FIG. 2H illustrates a formed seamless master 270, according to one embodiment. The seamless master 270 may be formed using any of the methods and embodiments discussed in FIGS. 2A-2G. For example, the masters 202 of FIGS. 2A-2G are separated from the anti-stick layer 224 and the substrate 222 once the seam 212 is filled with filling material 220 and cured, resulting in the formed seamless master 270. An anti-stick layer (not shown) may be coated or deposited on the first surface 236 of the seamless master 270 having the features 210 disposed thereon prior to the stamp forming process. As shown in FIG. 2H, the formed seamless master 270 comprises a seam 212 filled with filler material 220 such that a bottom surface 220A of the filler material 220 is flush or planar with a first surface 236 of the masters 202.

FIG. 2H further illustrates a seamless stamp 208 formed using the formed seamless master 270. The formed seamless master 270 imprints stamp material to form a seamless stamp 208 comprising negative features 226. A flat portion 228 of the seamless stamp 208 corresponding to the bottom surface 220A of the filler material 220 is flush or planar with a first surface 238 of the seamless stamp 208. The first surface 238 of the seamless stamp 208 is the negative of the first surface 236 of the masters 202. The negative features 226 may extend below the first surface 238 of the seamless stamp 208 by about 100 nm-500 nm. An underlayer 292 of the seamless stamp 208 extending from the bottom of the negative features to a second surface of the seamless stamp 294 may have a thickness of about 10 nm to about 3 mm.

The seamless stamp 208 can be used to imprint a final product, such as a large area substrate, without leaving a seam in the final product. For example, the seamless stamp 208 may be used to imprint and pattern a photoresist material which is deposited over a substrate to form a final product. The final product may include a photoresist material which has been patterned with the plurality of features 226 of the seamless stamp 208, along with a flat portion 228 corresponding to the filled seam 212. Since the method includes two transfer imprints, at the stamp level and the final product level, the final product will be a positive image of the masters 202.

In further embodiments, the method includes fewer or additional operations to pattern the substrate of the final product. For example, in one embodiment, an additional transfer imprint operation is performed in order to make a negative image of the masters on the substrate. In another embodiment, the masters are used to pattern the substrate directly, and the intermediate transfer imprint operations are eliminated.

The material of the seamless stamp 208 is generally any suitable material. In one example, the material of the seamless stamp 208 is a polydimethyl siloxane material (PDMS), or any other variation to PDMS that has been spin coated or deposited on a substrate. The material of the seamless stamp 208 may comprise silicones, nano glass, photopolymer, Ormostamp®, or a combination of materials.

Figure 3A:
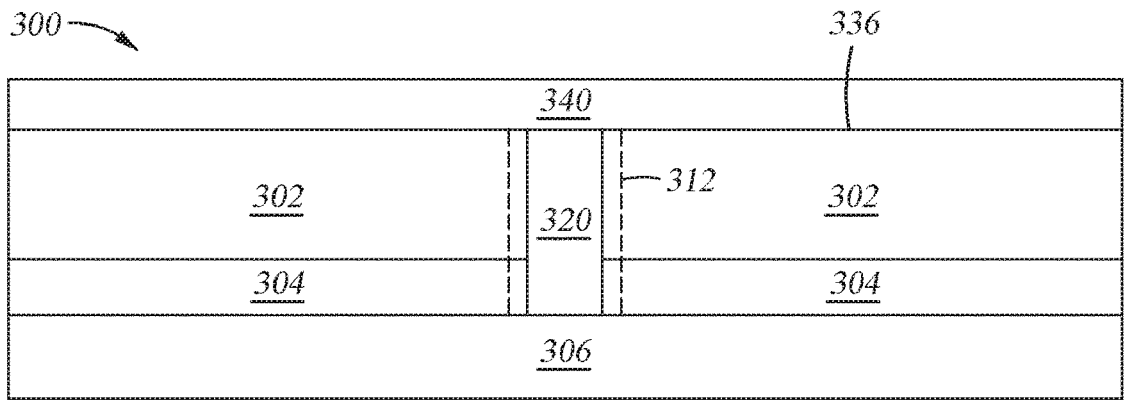
FIGS. 3A-3C depict various embodiments of forming a seamless master for imprint stamp manufacturing using a masking film, according to embodiments disclosed herein.
Figure 3B:
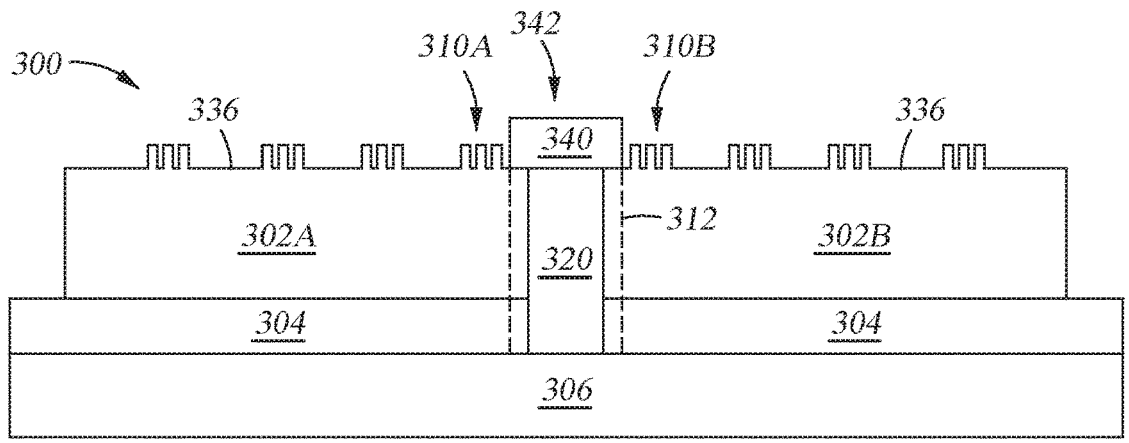
Figure 3C:
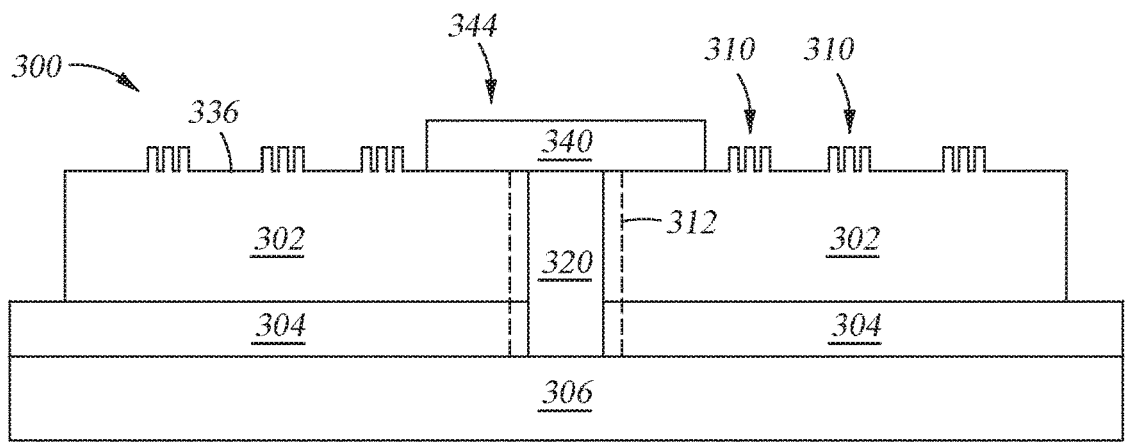

FIGS. 3A-3C depict various embodiments of forming a seamless master 300 for imprint stamp manufacturing using a masking film 340, according to embodiments disclosed herein, and are cross-sectional views. The methods depicted in FIGS. 3A-3C provide a master-level solution to seam and periphery challenges. In FIGS. 3A-3C, a plurality of masters 302 (two shown) are bonded to a backing plate 306 using the bonding material 304. While the bonding material 304 is shown as a continuous layer, the bonding material 304 may be applied to the backing plate 306 using screen printing or precision dispense to be selectively applied in a plurality of areas, like shown in FIGS. 2B-2E. The backing plate 306 may be one or more backing plates 306, each having one or more masters 302 bonded thereon. A seam 312 extending from the backing plate 306 to the first surface 336 of the masters 302 is disposed between adjacent masters 302. Each of the masters 302 have a pattern of features 310 disposed thereon. Each of the masters 302 may have an alternative pattern of features thereon, like shown in FIG. 1D.

In the embodiment of FIG. 3A, a masking film 340 is applied to a first surface 336 of the masters 302. The masking film 340 is applied or deposited to be conformal and in contact with the most of or the entire first surface 336 of the masters 302. The conformal deposition or application of the masking film 340 covers each of the features 310 (not shown in FIG. 3A) either completely or partially and may extend the entire length of the masters 302. Once the masking film 340 is applied, the seam 312 between the masters 302 is filled with the filler material 320, such as a polymer, so that the filler material 320 extends from the masking film 340 to the backing plate 306, and the filler material 320 is cured. The masking film 340 is then removed.

The masking film 340 may be removed using a blade, ablation, laser, chemical etch, patterning or any combination of the methods. Removal of the masking film 340 may occur upon thermal or ultraviolet treatment. The masking film 340 may comprise cured PDMS tape, Kapton®, etc.

In the embodiment of FIG. 3B, a masking film 340 is deposited on a first portion 342 each of the masters 302A-302B. The first portion 342 is disposed above the seam 312, completely covering the seam 312, and is disposed on the first surface 336 of each master 302A-302B. The first portion 342 is disposed between a first set of features 310A of a first master 302A and a second of features 310B of a second master 302B. The first set of features 310A and the second set of features 310B are disposed adjacent to the seam 312, and the first set of features 310A is adjacent to the second set of features 310B. The first portion 342 is disposed between the features 310A-310B so that the masking film 340 is not disposed over or on the features 310A-310B. Once the masking film 340 is deposited, the seam 312 between the masters 302A-302B is filled with the filler material 320 to extend from the masking film 340 to the backing plate 306, and the filler material 320 is cured. The masking film 340 is then removed.

In the embodiment of FIG. 3C, a masking film 340 is deposited on a second portion 344 of the masters 302. The second portion 344 is disposed above the seam 312, completely covering the seam 312, and is disposed on the first surface 336 of each master 302. The second portion 344 may include one or more of the features 310 adjacent to the seam 312 such that the masking film 340 is deposited on or over one or more features 310 of each master 302. The second portion 344 of FIG. 3C is larger than the first portion 342 of FIG. 3B, but smaller than the conformal deposition of FIG. 3A. Once the masking film 340 is deposited, the seam 312 between the masters 302 is filled with the filler material 320 to extend from the masking film 340 to the backing plate 306, and the filler material 320 is cured. The masking film 340 is then removed.

Following the removal of the masking film 340 in FIGS. 3A-3C, the filler material 320 filling the seam 312 will be flush with the first surface 336 of the masters 302, resulting in a formed seamless master 270 like shown in FIG. 2H. An anti-stick layer (not shown) may be coated or deposited on the first surface 336 of the masters 302 having the features 310 disposed thereon prior to the stamp forming process. The formed seamless master 270 may then be used to imprint a stamp, resulting in a seamless stamp 208 like shown in FIG. 2H. The seamless stamp 208 can be used to imprint a final product, such as a large area substrate, without leaving a seam in the final product.

Figure 4A:
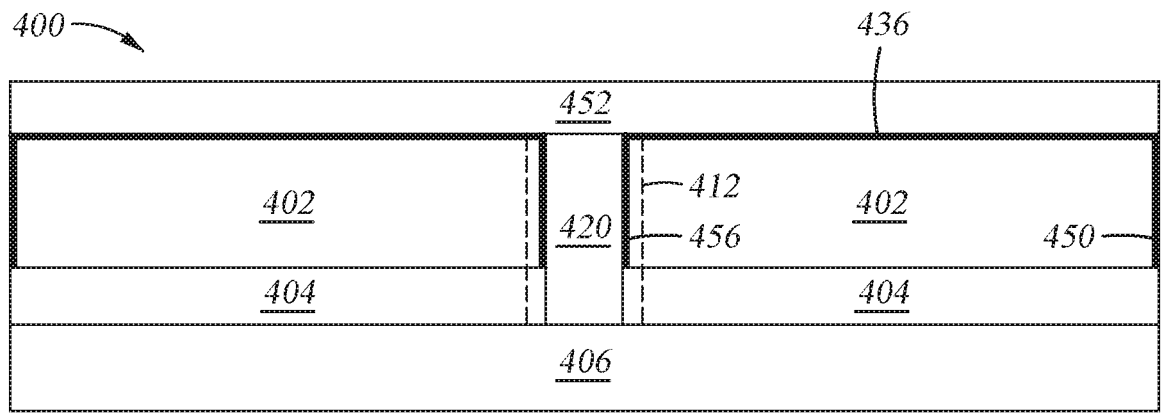
FIGS. 4A-4B depict various embodiments of forming a seamless master for imprint stamp manufacturing by removing excess filler material, according to embodiments disclosed herein.
Figure 4B:
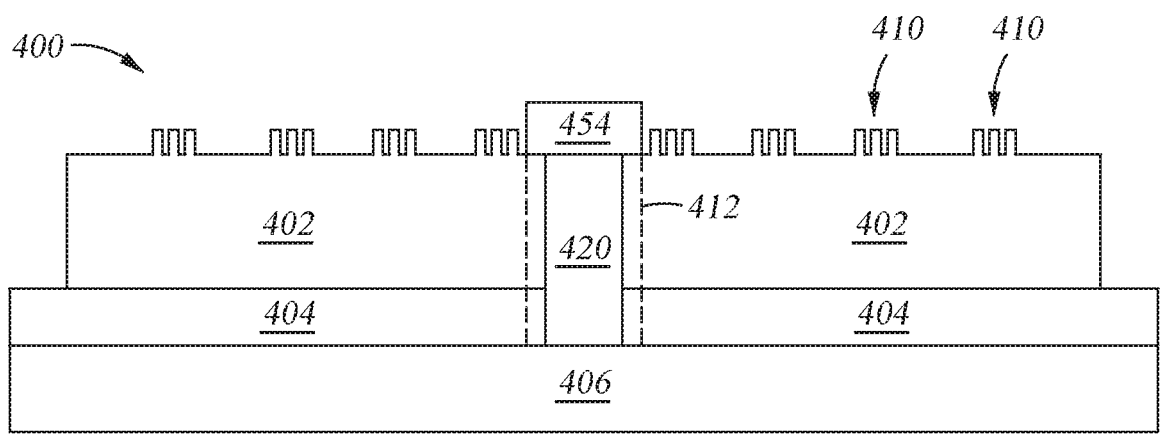

FIGS. 4A-4B depict various embodiments of forming a seamless master 400 for imprint stamp manufacturing by removing excess filler material 420, according to embodiments disclosed herein, and are cross-sectional views. The methods depicted in FIGS. 4A-4B provide a master-level solution to seam and periphery challenges. In the embodiments of FIG. 4A and FIG. 4B, a plurality of masters 402 (two shown) are bonded to the backing plate 406 using the bonding material 404. While the bonding material 404 is shown as a continuous layer, the bonding material 404 may be applied to the backing plate 406 using screen printing or precision dispense to be selectively applied in a plurality of areas, like shown in FIGS. 2B-2E. The backing plate 406 may be one or more backing plates 406, each having one or more masters 402 bonded thereon. Each of the masters 402 have a pattern of features 410 disposed thereon. Each of the masters 402 may have an alternative pattern of features thereon, like shown in FIG. 1D. A seam 412 extending from the backing plate 406 to the first surface 436 of the masters 402 is disposed between each set of masters 402. The seam 412 between the masters 402 is then filed with filler material 420, such as a polymer or a material with etch selectivity with reference to the master 402.

In FIG. 4A, excess filler material 420 is dispensed on a first portion 452 of the masters 402. The first portion 452 is disposed on the first surface 436 of the masters 402. In one embodiment, the first portion 452 comprises the entire length of the first surface 436 of each master 402 such that the filler material 420 is disposed over all the features 410 of the masters 402. In another embodiment, the first portion 452 is less than the entire length of the masters 402, but still includes one or more features 410 of each master 402 disposed adjacent to the seam 412. As long as the filler material 420 is disposed above the seam 412, the filler material 420 need not be equally disposed on each master 402. The filler material 420 is then cured.

Once the filler material 420 is deposited and cured, the excess filler material 420 disposed on the first portion 452 of the masters 402 is removed so that the filler material 420 disposed in the seam 412 is flush with the first surface 436 of the masters 402. The excess filler material 420 disposed on the first portion 452 may be removed using a blade, ablation, laser, chemical etch, patterning, thermal or ultraviolet cure, or any combination of the methods. Prior to depositing the filler material 420, a thin layer of anti-stick material 450 may be deposited on the first surface 436 of the masters 402 and on a second surface 456 of each master 402 within the seam 412 (i.e., the sides or the perimeter of the seam 412). The anti-stick material 450 facilitates the release of the excess filler material 420 from the first portion 452. The anti-stick layer 450 may be removed concurrently with or after the excess filler material 420 is removed from the first portion 452. The anti-stick layer 450 may consist of any suitable material that enables anti-stiction properties, such as compounds including halogens, silane, etc.

In FIG. 4B, the filler material 420 is selectively disposed on a second portion 454 of the masters 402 disposed above the seam 412. The second portion 454 is disposed on the first surface 436 of the masters 402. The second portion 454 may be disposed between adjacent features 410 of each master 402 such that the filler material 420 is not disposed over or on any features 410 of the masters 402. The second portion 454 may be partially disposed on features 410 of at least one master 402 adjacent to the seam 412 such that the filler material 420 is disposed over or on one or more features 410 of at least one of the masters 402. As long as the filler material 420 is disposed above the seam 412, the filler material 420 need not be equally disposed on each master 402. The filler material 420 may be selectively deposited on the second portion 454 by forming a dam, such as by using films or by patterning. The second portion 454 of FIG. 4B may be the same as the first portion 342 described in FIG. 3B. The filler material 420 is then cured.

Once the filler material 420 is deposited and cured, the excess filler material 420 disposed on the second portion 454 of the masters 402 is removed such that the filler material 420 disposed in the seam 412 is flush with the first surface 436 of the masters 402. The excess filler material 420 disposed on the second portion 454 may be removed using a blade, ablation, laser, chemical etch, patterning or any combination of the methods. Prior to depositing the filler material 420, a thin layer of anti-stick material 450 may be deposited on the first surface 436 of the masters 402 and on a second surface 456 of each master 402 within the seam 412 (i.e., the sides or the perimeter of the seam 412), like shown in FIG. 4A. The anti-stick layer 450 may be removed concurrently with or after the excess filler material 420 is removed from the second portion 454. The anti-stick layer 450 may be reapplied to the first surface 436 of the masters 402 after the excess filler material 420 is removed.

Following the removal of the excess filler material 420 from the first portion 452 or the second portion 454 in FIGS. 4A-4B, the filler material 420 filling the seam 412 will be flush with the first surface 436 of the masters 402, resulting in a formed seamless master 270 like shown in FIG. 2H. The formed seamless master 270 may then be used to imprint a stamp, resulting in a seamless stamp 208 like shown in FIG. 2H. The seamless stamp 208 can be used to imprint a final product, such as a large area substrate, without leaving a seam in the final product.

Figure 5A:
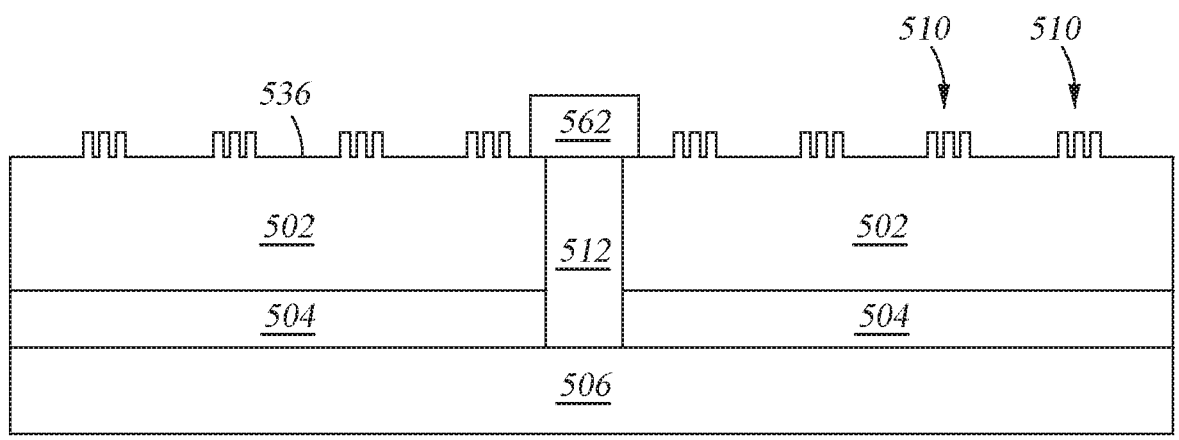
FIGS. 5A-5B depict various embodiments of forming a seamless stamp, according to embodiments disclosed herein.
Figure 5B:
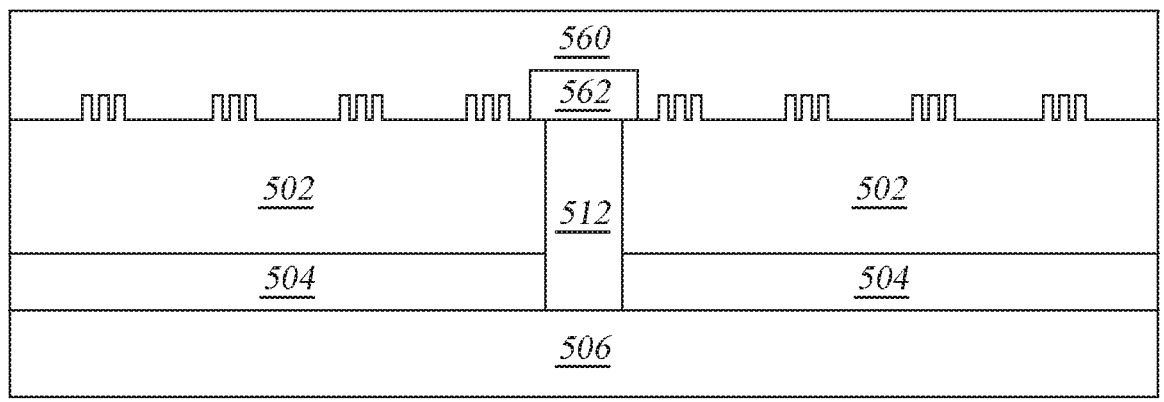
Figure 5C:
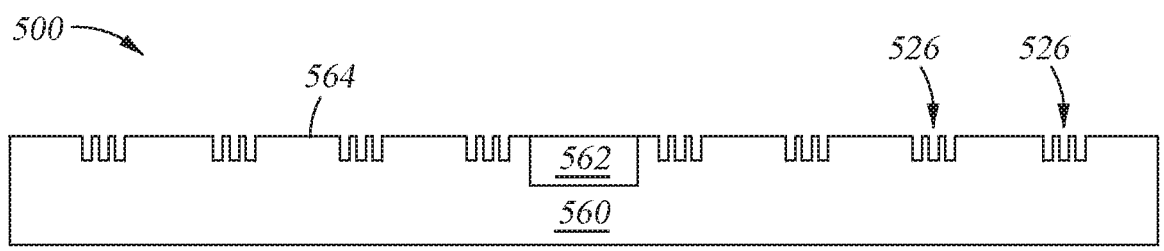
FIG. 5C depicts an embodiments of a seamless stamp, according to embodiments disclosed herein.

FIGS. 5A-5B depict various embodiments of forming a seamless stamp, according to embodiments disclosed herein. FIG. 5C illustrates a formed seamless stamp 500, according to embodiments disclosed herein, and are cross-sectional views. The method depicted in FIGS. 5A-5B provides a master-level solution to seam and periphery challenges. In FIGS. 5A-5B, a plurality of masters 502 (two shown) are bonded to the backing plate 506 using the bonding material 504. The backing plate 506 may be one or more backing plates 506, each having one or more masters 502 bonded thereon. An anti-stick layer (not shown) may be coated or deposited on the first surface 536 of the masters 502 having the features 510 disposed thereon. A seam 512 extending from the backing plate 506 to the first surface 536 of the masters 502 is disposed between each set of masters 502. Each of the masters 502 have a pattern of features 510 disposed thereon. Each of the masters 502 may have an alternative pattern of features thereon, like shown in FIG. 1D.

As shown in FIG. 5A, a seam blocking strip 562 is then positioned above the seam 512 on the first surface 536 of the masters 502. In an embodiment where an anti-stick layer (not shown) is deposited on the first surface 536 of the masters 502, the seam blocking strip 562 is deposited on the anti-stick layer. The seam blocking strip 562 covers the seam 512 and is contact with the first surface 536 of each of the masters 502. The seam blocking strip 562 may be predefined or preformed prior to being positioned over the seam 512. The seam blocking strip 562 may be formed using injection molding. The seam blocking strip 562 may be selectively positioned on the first surface 536 by forming a dam, such as by using films or by patterning. The seam blocking strip 562 is selectively positioned above the seam 512 so that the seam blocking strip 562 does not cover the features 510 and is not disposed within the seam 512. The seam blocking strip 562 is positioned to be flush with the first surface 536 of the masters 502.

As shown in FIG. 5B, stamp material 560 is then deposited over the seam blocking strip 562, the first surface 536 of the masters 502, and the features 510. The seam blocking strip 562 and the stamp material 560 may be the same material, or the seam blocking strip 562 may comprise a different material than the stamp material 560. The stamp material 560 is then cured. Curing the stamp material 560 forms a seamless stamp 500 comprising the seam blocking strip 562, as shown in FIG. 5C. The seamless stamp 500 is the negative pattern of the masters 502. The seam blocking strip 562 prevents the seamless stamp 500 from having a negative pattern of the seam 512. The seam blocking strip 562 is flush with a first surface 564 of the seamless stamp 500. The first surface 564 of the seamless stamp 500 is the negative pattern of the first surface 536 of the masters 502. The seamless stamp 500 comprises negative features 526, corresponding to the features 510 of the masters 502.

The stamp material 560 is generally any suitable material, such as a material that is UV or thermal curable. In one example, the stamp material 560 is a polydimethyl siloxane material (PDMS), or any other variation to PDMS that has been spin coated or deposited on a substrate. The stamp material 560 may comprise silicones, nano glass, photopolymer, Ormostamp®, or a combination of materials. The stamp material 560 may be comprised of a material having anti-stick properties.

In the above discussed embodiments, the filler material 220, 320, 420 of FIGS. 2A-4B and the bonding material 204, 304, 404, 504 of FIGS. 2A-5B are generally any suitable material, such as any material that is UV or thermal curable. In one example, the filler material 220, 320, 420 and the bonding material 204, 304, 404, 504 are a polymer. In another example, the filler material 220, 320, 420 and the bonding material 204, 304, 404, 504 are a low viscosity adhesive that is able to fill gaps or seams that are between about 100 μm and about 500 μm in width, such as a low viscosity silicone. The bonding material 204, 304, 404, 504 may comprise the same material as the filler material 220, 320, 420, or may comprise a different material. The bonding material 204, 304, 404, 504 may comprise a homogenous adhesive or a mixture of adhesives. In one embodiment, the filler material 220, 320, 420 and the bonding material 204, 304, 404 are differentiated by the viscosity and/or coefficient of thermal expansion (CTE).

The backing plate 206, 306, 406, 506 of FIGS. 2A-5B is generally any suitable substrate material, including but not limited to, glass, fused silica, quartz, aluminum, or stainless steel. The masters 202, 302, 402, 502 of FIGS. 2A-5B are generally any suitable substrate material, including but not limited to, glass, silicon, or III-V materials. The masters 202, 302, 402, 502 may have a thickness between about 100 μm-3000 μm while the features 210, 310, 410, 510 of the masters 202, 302, 402, 502 have length between about 100 nm-500 nm. The anti-stick layer 450 of FIGS. 4A-4B may be deposited or applied to the first surface 236, 336, 436, 536 of the masters 202, 302, 402, 502 of FIGS. 2A-5B prior to the stamp forming/imprinting process. The anti-stick layer deposited or applied to the first surface 236, 336, 436, 536 of the masters 202, 302, 402, 502 of FIGS. 2A-5B may have a thickness between about 1 angstroms to about 10 nm.

Figure 6A:
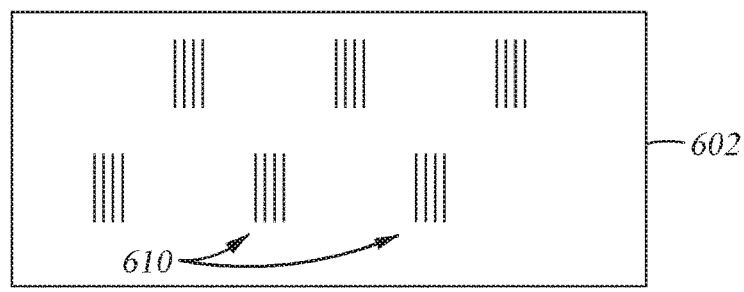
FIG. 6A illustrates a lattice arrangement of features on a master, according to embodiments disclosed herein.

The depth of the features 210, 310, 410, 510 may vary through the respective masters 202, 302, 402, 502. The features 210, 310, 410, 510 may be comprise of either linear or curved gratings, circular or elliptical holes, meshes, etc. The lattice arrangement of the features 210, 310, 410, 510 is not limited to cubic, but may be triangular, hexagonal, honeycombed, etc. For example, FIG. 6A illustrates a lattice arrangement of the features 610 on a master 602 where the features 610 are disposed in rows that are unaligned or offset from one another. The cross-section of the features 210, 310, 410, 510 of the masters 202, 302, 402, 502 is not limited to rectangular, but may be cylindrical, blazed, sloped, etc. The slope of the features 210, 310, 410, 510 may vary through the respective masters 202, 302, 402, 502.

Figure 6B:
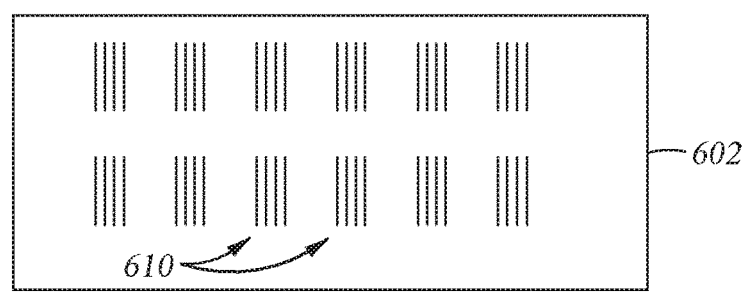
FIGS. 6B-6E illustrates masters of various shapes, according to embodiments disclosed herein.
Figure 6C:
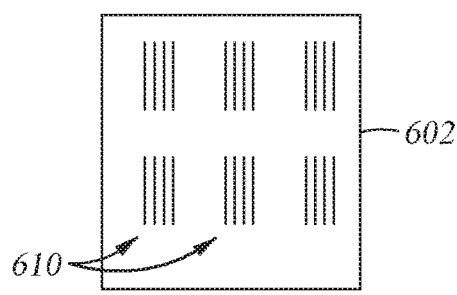
Figure 6D:
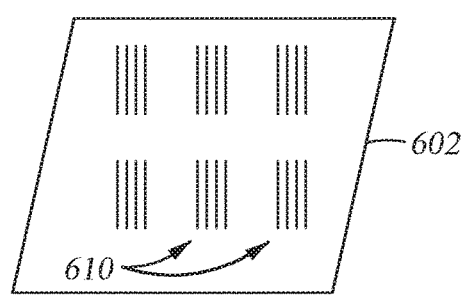
Figure 6E:
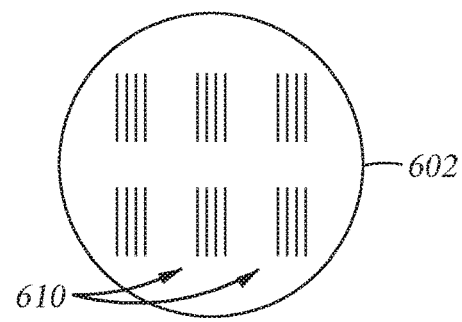

The cross-section of the master 202, 302, 402, 502 of FIGS. 2A-5B is not limited to rectangular, but may be cylindrical, sloped, etc. FIG. 6B illustrates a regular master 602. FIG. 6C illustrates a square master 602. FIG. 6D illustrates a trapezoidal master 602. FIG. 6E illustrates a circular master 602. An anti-stick layer, such as the anti-stick layer 450 of FIGS. 4A-4B, maybe applied on the first surface 236, 336, 436, 536 of the master 202, 302, 402, 502 prior to dispensing the stamp or imprint material resulting in the seamless stamp. FIGS. 6A-6E illustrate masters 602 when viewed from the surface of the masters 602 having the features disposed thereon, such as the first surface 236, 336, 436, 536 of the masters 202, 302, 402, 502 of FIGS. 2A-5B.

The disclosed methods and apparatus are beneficially used to pattern nanoscale features on large area substrates, such as 100 nanometer (nm) or greater display devices, with reduced or eliminated patterning issues at the seams and periphery. For example, the disclosed methods and apparatus can be used imprint a display device with nanofeatures, such as 100 nm features or 50 nm features, with reduced or eliminated patterning issues at the seams and periphery. The disclosed methods and apparatus are useful to pattern Liquid Crystal Displays (LCDs), Light Guide Plates (LGPs), Light Field Plates (LFPs), and Wire Grid Polarizers (WGPs), in addition to other display devices and other optical elements or films for other applications including automotive applications, or augmented reality or virtual reality headsets or smart windows.

By reducing or eliminating the patterning irregularities at the seams and periphery, the functionality of the optical device is generally improved. For example, in an LGP, reducing or eliminating the irregularities at the seam and periphery will reduce the light loss from the device. In an LCD, reducing or eliminating the irregularities at the seam and periphery will improve the quality of the projected image from the display and viewers will not see the patterned seams in the image being projected.

While the foregoing is directed to embodiments of the present disclosure, other and further embodiments of the disclosure may be devised without departing from the basic scope thereof, and the scope thereof is determined by the claims that follow.

What is claimed is:

1. A method of forming a seamless master, comprising:
depositing a first anti-stick layer on a substrate;
aligning a plurality of masters on the substrate, each master having a plurality of features extending from a first surface, the first surface of the plurality of masters being conformal with the first anti-stick layer;
adhering a second surface of the plurality of masters to a backing plate, the second surface being opposite the first surface, wherein adjacent masters of the plurality of masters have a seam therebetween extending from the first anti-stick layer to the backing plate;
upon aligning the plurality of masters on the substrate and adhering the second surface of the plurality of masters to the backing plate, filling the seam between the adjacent masters of the plurality of masters with a filler material;
curing the filler material; and
removing the plurality of masters from the first anti-stick layer and the substrate.

2. The method of claim 1, further comprising:
depositing a second anti-stick layer on the features and the first surface of the plurality of masters after the plurality of masters are removed from the first anti-stick layer and the substrate; and
imprinting a stamp material with the plurality of masters adhered to the backing plate to form a seamless stamp.

3. A method of forming a seamless master, comprising:
depositing a first anti-stick layer on a substrate;
aligning a plurality of masters on the substrate, each master having a plurality of features extending from a first surface, the first surface of the plurality of masters being conformal with the first anti-stick layer;
adhering a second surface of the plurality of masters to a backing plate, the second surface being opposite the first surface, wherein adjacent masters of the plurality of masters have a seam therebetween extending from the first anti-stick layer to the backing plate;
filling the seam between the adjacent masters of the plurality of masters with a filler material;
curing the filler material; and
removing the plurality of masters from the first anti-stick layer and the substrate, wherein the backing plate comprises a plurality of vias extending through the backing plate, at least one via of the plurality of vias being disposed above each seam.

4. The method of claim 3, wherein each seam is filled with the filling material through the at least one via.

5. The method of claim 4, wherein the at least one via is in contact with each seam and extends through the backing plate perpendicular to the second surface of each of the plurality of masters.

6. The method of claim 4, wherein the at least one via is in contact with each seam and extends through the backing plate parallel to the second surface of each of the plurality of masters.

7. A method of forming a seamless master, comprising:
adhering a plurality of masters to a backing plate, each master having a plurality of features extending from a first surface, each pair of the plurality of masters having a seam therebetween, wherein a second surface of the plurality of masters opposite the first surface is adhered to the backing plate;

depositing a masking film over a portion of each of the plurality of masters, the portion being disposed on the first surface of each of the plurality of masters;

upon adhering the plurality of masters to the backing plate and depositing the masking film, filling the seam between each pair of the plurality of masters with a filler material;

curing the filler material; and removing the masking film.

8. The method of claim 7, further comprising:

depositing an anti-stick layer on the features and the first surface of the plurality of masters after the masking film is removed; and imprinting a stamp material with the plurality of masters adhered to the backing plate to form a seamless stamp.

9. The method of claim 7, wherein the portion of each of the plurality of masters comprises the entire first surface of each of the plurality of masters, the masking film being conformal to and in contact with the entire first surface of each of the plurality of masters.

10. The method of claim 7, wherein the portion of each of the plurality of masters is disposed directly above each of the seams, the portion being disposed between adjacent sets of features of each pair of the plurality of masters.

11. The method of claim 7, wherein the portion of each of the plurality of masters is disposed directly above each of the seams, the portion being disposed on one or more sets of features of the plurality of features of each pair of the plurality of masters.

12. A method of forming a seamless master, comprising:

adhering a plurality of masters to a backing plate, each master having a plurality of features extending from a first surface, each pair of the plurality of masters having a seam therebetween, wherein a second surface of the plurality of masters opposite the first surface is adhered to the backing plate;

filling the seam between each pair of the plurality of masters with a filler material, wherein filling the seam between each pair of masters comprises depositing excess filler material on the first surface of each of the plurality of masters;

curing the filler material and the excess filler material; and removing the excess filler material disposed on the first surface of each of the plurality of masters.

13. The method of claim 12, further comprising:

depositing an anti-stick layer on the features and the first surface of the plurality of masters after the excess filler material is removed; and imprinting a stamp material with the plurality of masters adhered to the backing plate to form a seamless stamp.

14. The method of claim 12, wherein the excess filler material is removed using a blade, a laser, or a chemical etch.

15. The method of claim 12, further comprising:

depositing an anti-stick layer on the first surface of each of the plurality of masters and on a perimeter of the seam prior to filling the seam between each pair of the plurality of masters with the filler material; and removing the anti-stick layer after the excess filler material is removed.

* * * * *